United States Patent
Wang et al.

(10) Patent No.: US 7,619,894 B2
(45) Date of Patent: Nov. 17, 2009

(54) HEAT DISSIPATION DEVICE

(75) Inventors: Shaw-Fuu Wang, Taipei (TW);
Ting-Chiang Huang, Taipei (TW);
Shih-Chen Shen, Taipei (TW);
Sheng-Jie Syu, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 12/035,802

(22) Filed: Feb. 22, 2008

(65) Prior Publication Data

US 2009/0213555 A1  Aug. 27, 2009

(51) Int. Cl.
*H05K 7/20* (2006.01)
*F28F 7/00* (2006.01)
*F04B 43/04* (2006.01)

(52) U.S. Cl. ............... 361/719; 165/80.2; 165/185; 165/122; 257/718; 310/17

(58) Field of Classification Search .................. None
See application file for complete search history.

(56) References Cited

U.S. PATENT DOCUMENTS

| | | | | |
|---|---|---|---|---|
| 4,923,000 A | * | 5/1990 | Nelson | 165/122 |
| 5,488,255 A | * | 1/1996 | Sato et al. | 257/718 |
| 5,522,712 A | * | 6/1996 | Winn | 417/436 |
| 6,043,978 A | * | 3/2000 | Mody et al. | 361/690 |
| 6,232,680 B1 | * | 5/2001 | Bae et al. | 310/17 |
| 6,937,472 B2 | * | 8/2005 | Pokhama | 361/700 |
| 7,248,475 B2 | * | 7/2007 | Paydar et al. | 361/695 |
| 7,397,164 B1 | * | 7/2008 | Ali | 310/311 |
| 2008/0137289 A1 | * | 6/2008 | Arik et al. | 361/689 |
| 2008/0310110 A1 | * | 12/2008 | Arik et al. | 361/699 |

* cited by examiner

*Primary Examiner*—Gregory D Thompson
(74) *Attorney, Agent, or Firm*—Workman Nydegger

(57) ABSTRACT

A heat dissipation device, electrically connected to an intermittent power source, is used for dissipating heat generated by a heat-generating element on a circuit board. The heat dissipation device has at least one coil and at least one vibrating sheet. The coil is used to receive the intermittent power source to produce a magnetic field. One end of the vibrating sheet is fixed, and the other end is suspended over the coil. The suspended end flutters periodically under the magnetic force of the intermittent magnetic field, so as to produce an airflow.

7 Claims, 7 Drawing Sheets

HEAT DISSIPATION DEVICE

BACKGROUND OF THE INVENTION

1. Field of Invention

The present invention relates to a heat dissipation device, and more particularly to a heat dissipation device applicable to a portable electronic device.

2. Related Art

Currently, with the rapid development of electronic technology, consumers pay more attention to light, thin, and portable consumer electronic products. Thus, electronic products, like portable electronic devices such as notebooks, ultra mobile personal computers (UMPCs), and Personal Digital Assistant (PDAs), are all developed toward microminiaturization. For users who often travel outside, portable electronic products are easier to carry, thus greatly improving convenience in use.

The UMPC, for example, employs electronic elements with fast operating speed and extremely small volume. Consequently, the heat generation amount per unit area is increased. If the heat cannot be dissipated instantly, the overhigh temperature may seriously affect the stability and efficiency of the electronic elements in operation, and may even reduce the service life of the computer or cause damages thereto.

To solve the heat dissipation problem of a portable computer, conventionally a fan is installed inside the computer for dissipating the heat generated by the electronic elements, and meanwhile lowering the ambient temperature in the computer. However, as the portable computer is short and thin, excluding the space occupied by the necessary circuit layouts and the electronic elements, the remnant free space inside the computer is limited, and it is difficult to add an extra heatsink fan.

In consideration of the overall heat dissipation efficiency of a computer, it is better to utilize a large fan for dissipating heat. In this manner, the circuit layout inside the computer must be changed to cater for the fan, which results in a high manufacturing cost and the increase of the volume of the computer due to the installation of the fan, which goes against the current consumers' requirements on light, thin, short, and small electronic products. In consideration of the circuit layout inside the computer and the volume of the computer, a micro fan is selected. However, the heat dissipation efficiency of the micro fan may hardly meet the heat dissipation requirement of micro electronic elements that generate large amount of heat.

The air introduced during the operation of the conventional fan may cause friction with members like the case and the air duct, and make noises of a certain frequency. As a fan is installed in a light and thin UMPC, the noises generated by the fan are directly transmitted to the outside without blocking, thus resulting in a severe noise problem. The technicians in the relevant art are in urgent need of finding a solution to eliminate the noise problem.

SUMMARY OF THE INVENTION

In view of the above problems, the present invention is to provide a heat dissipation device, so as to solve the problems existing in the conventional heatsink applied to a portable electronic device. The circuit layout and the allocation of the electronic elements in the electronic device are limited as the conventional heatsink occupies too much space, thus causing problems such as poor heat dissipation efficiency and very large noises.

The heat dissipation device of the present invention is electrically connected to an intermittent power source, for dissipating the heat generated from at least one heat-generating element (at least one electronic component) on a circuit board. The heat dissipation device includes at least one coil and at least one vibrating sheet. The coil is used to receive the intermittent power source to produce an intermittent magnetic field. The vibrating sheet has a fixed portion and a movable portion extending from the fixed portion. The fixed portion is fixed on the circuit board, and the movable portion is suspended over the coil. The movable portion flutters periodically under the magnetic force of the intermittent magnetic field, so as to produce an airflow heading toward the heat-generating element.

The heat dissipation device disclosed in the present invention is light and thin, and can be modularized for assembly, such that the portable electronic device becomes much thinner. Further, as the vibrating sheet produces a thermal conducting airflow under the intermittent magnetic force, the very large noises generated by the conventional fan is eliminated, and meanwhile the power consumed by the heat dissipation device in operation is greatly reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The heat dissipation device of the present invention is used to dissipate the heat generated by an electronic device. The electronic device can be an UMPC, a personal computer, a laptop computer, or a PDA, but not limit to the above-mentioned electronic devices. In the following detailed description of the present invention, the UMPC is taken as a preferable embodiment of the present invention for illustration. The accompanying drawings are incorporated as reference, and are not intend to limit the present invention.

Figure 1A:
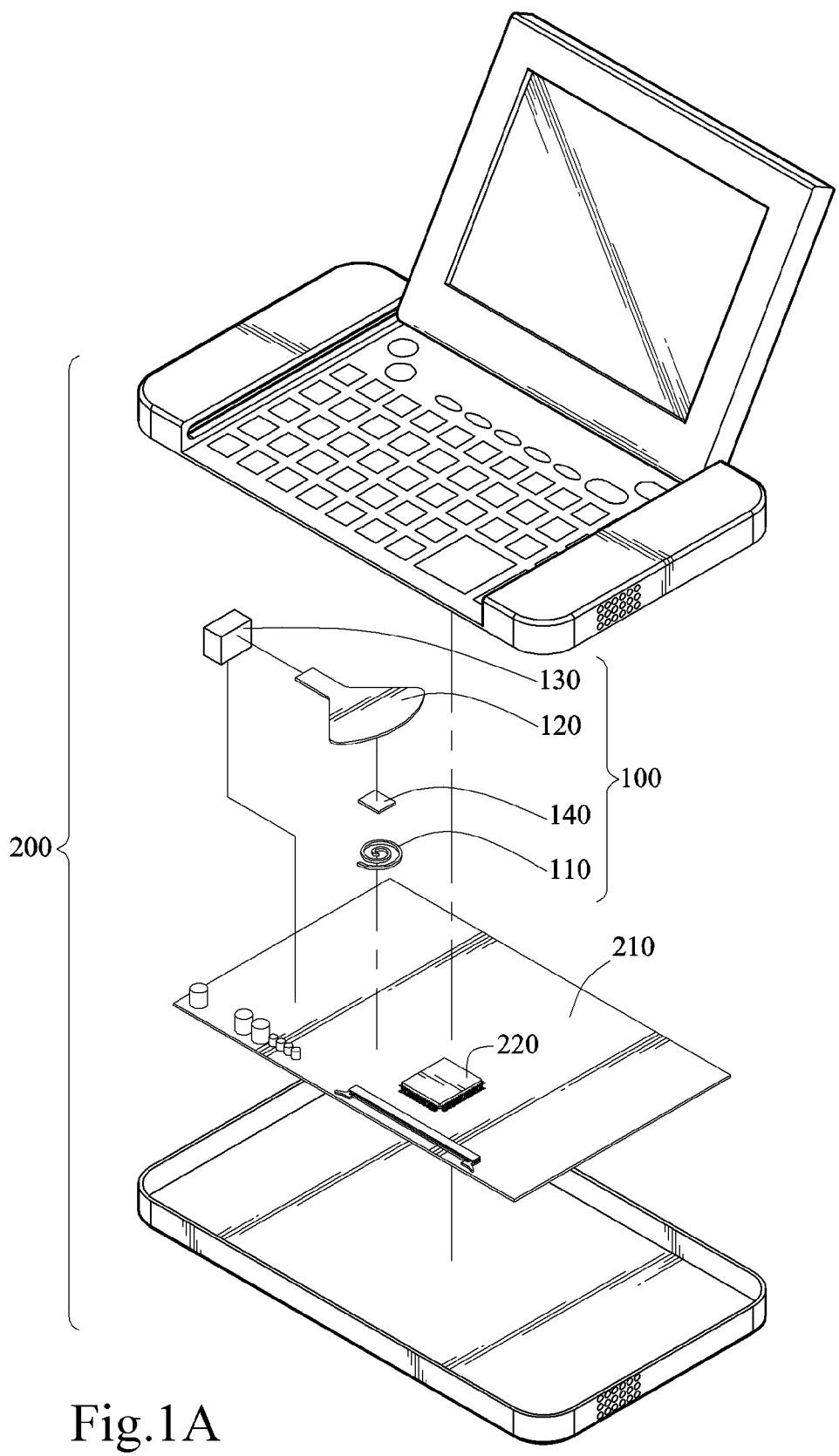
FIG. 1A is an exploded view of a heat dissipation device according to a first embodiment of the present invention.
Figure 1B:
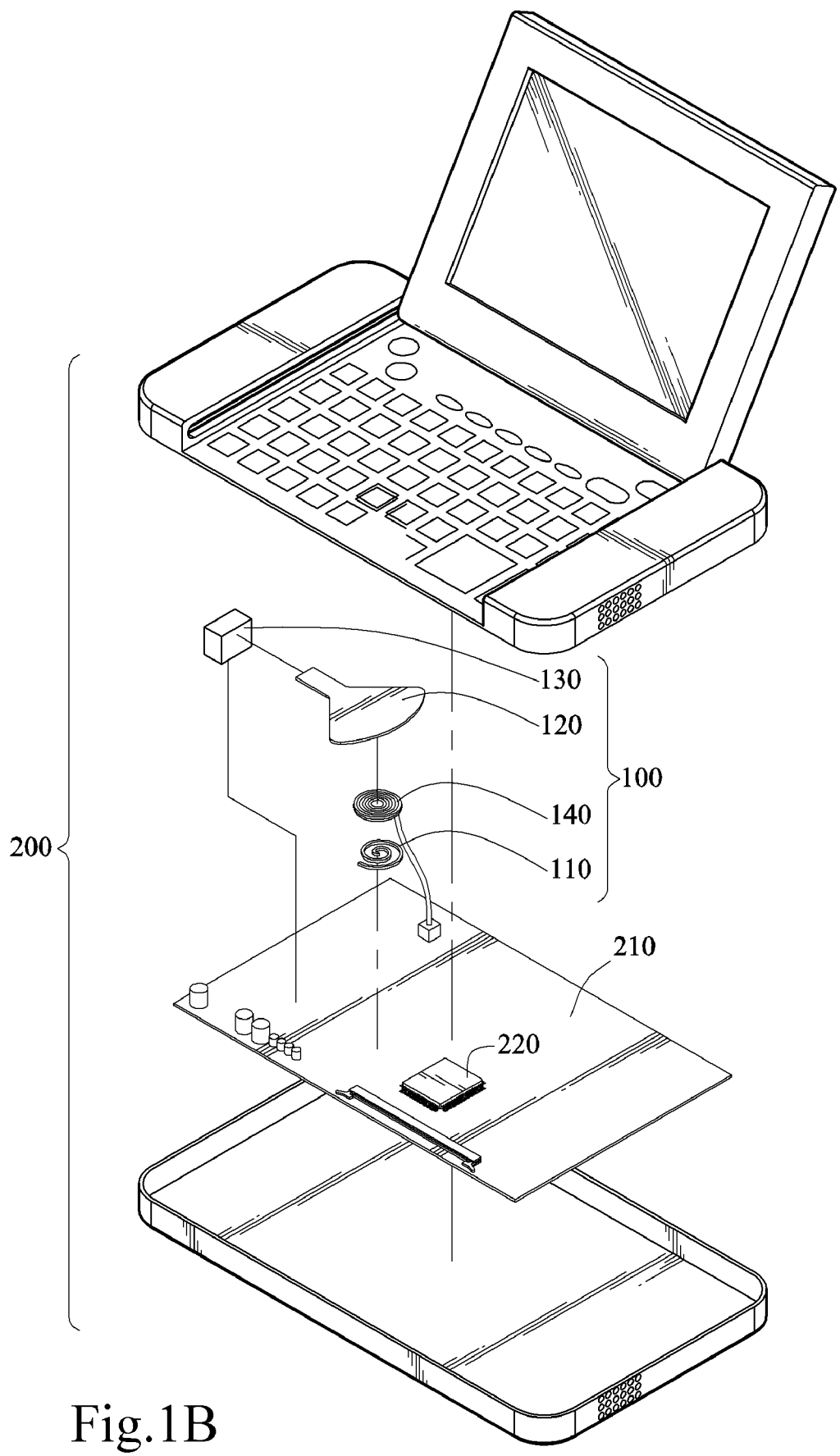
FIG. 1B is an exploded view of a heat dissipation device according to a first embodiment of the present invention.
Figure 2A:
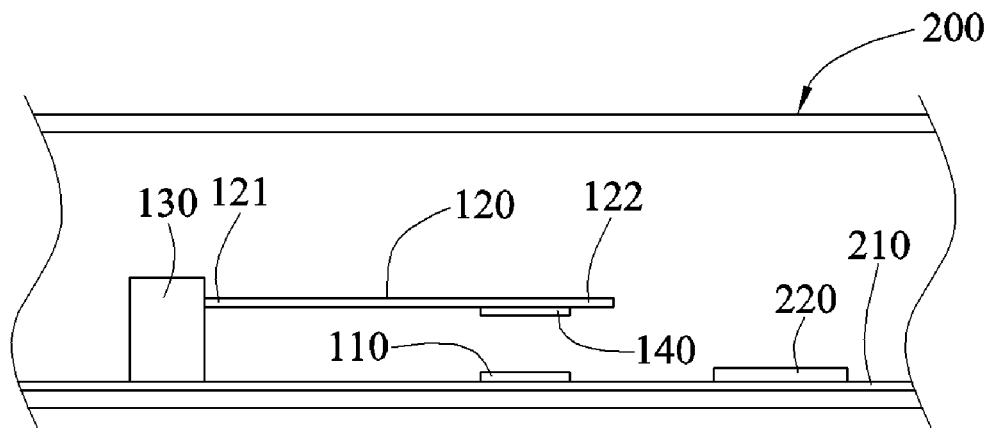
FIG. 2A is a side view of a heat dissipation device according to a first embodiment of the present invention.
Figure 2B:
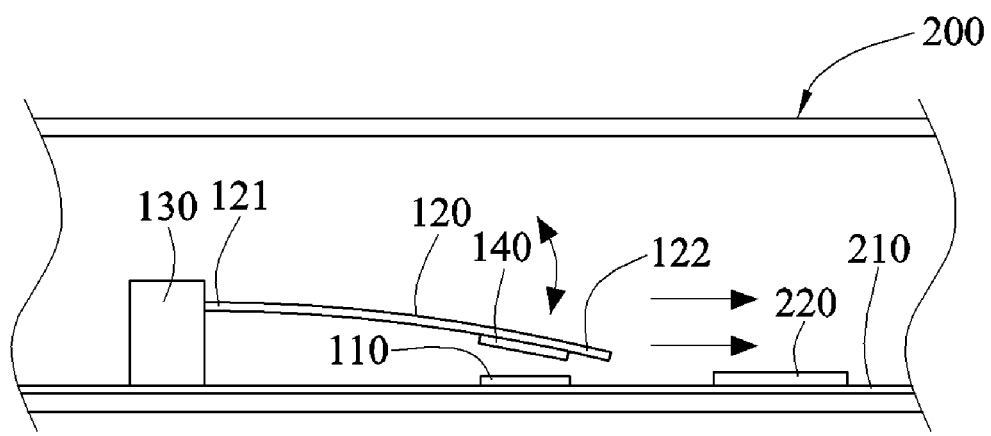
FIG. 2B is a side view of a heat dissipation device in operation according to a first embodiment of the present invention.

Please refer to the exploded views of FIGS. 1A and 1B, a heat dissipation device 100 according to a first embodiment of the present invention is disposed inside an electronic device 200, and electrically connected to a intermittent power source, for dissipating the heat generated by at least one heat-generating element 220 (at least one electronic component) on a circuit board 210. The intermittent power source may be a direct current (DC) power source having a plurality of consecutive power intervals and no-power interval, or an alternating current (AC) power source with a fixed current period, such as a sinusoidal wave power source. The aforementioned intermittence may be a fixed period or a variable period, and may also be a pulse width modulation (PWM) signal. The clock lengths of the power intervals and no-power intervals of the intermittent power source, or the time durations of the positive, negative semi-cycles of the AC power source are controlled by a basic input/output system (BIOS), such that the electric power may be output to the heat dissipation device 100 at a stable power supply period.

As shown in FIGS. 1A, 1B, 2A, and 2B, the heat dissipation device 100 according to the first embodiment of the present invention includes at least one coil 110 and at least one vibrating sheet 120. The coil 110 is disposed on the circuit board 210, and adjacent to the heat-generating element 220. The coil 110 is electrically connected to the circuit of the circuit board 210, such that an electrical signal can be transmitted between the coil 110 and the circuit board 210. In the present invention, the coil 110 may be disposed on the circuit board 210 by means of, for example, welding or direct forming.

The coil 110 receives the intermittent power source through the circuit board 210 to produce an intermittent magnetic field. In addition to being electrically disposed on the circuit board 210, the coil 110 of the present invention can also be disposed at other positions, like the inner side of the case of the electronic device 200, according to actual heat dissipation requirements, and receives the intermittent power source to produce a magnetic field. Therefore, the position of the coil 110 is not limited to this embodiment.

As shown in FIGS. 1A, 1B and 1C. The vibrating sheet 120 is an elastic material, and thus has good deformation elasticity. The vibrating sheet 120 has a fixed portion 121 and a movable portion 122 extending from the fixed portion 121. The surface area of the movable portion 122 is greater than that of the fixed portion 121, and the movable portion 122 may be, but not limited to, fan-shaped, arc-shaped, or in other shapes easy to produce an airflow.

A support block 130 is mounted on the circuit board 210, and the fixed portion 121 of the vibrating sheet 120 is fixed on the support block 130, such that the movable portion 122 remains suspended over the coil 110 at a distance. The support block 130 is made of a non-conductive material, so as to avoid electrical short of the circuit board 210. A magnetic element 140 is disposed on the movable portion 122 at the side facing to the coil 110, so as to interact with the magnetic field produced by the coil 110, such that the movable portion 122 deforms toward the coil 110 during the power intervals of the intermittent power source, and restores to its original state during the no-power intervals. As a result, the movable portion 122 flutters up and down intermittently under the repeated action of the magnetic force, thus producing an airflow heading toward the heat-generating element 220.

Otherwise, the coil 110 receives an electric power provided by an AC power source, and the movable portion 122 of the vibrating sheet 120 is close to the coil 110. The coil 110 alternately produces a magnetic field attracting and repulsing the magnetic element 140 according to the current period of the AC power source. When the coil 110 produces a magnetic field repulsing the magnetic element 140, the movable portion 122 is pushed to deform away from the coil 110. When the coil 110 produces a magnetic field attracting the magnetic element 140, the movable portion 122 away from the coil 110 is attracted by the coil 110 and deforms toward the coil 110. The movable portion 122 repeats fluttering up and down under the effect of different directions of magnetic field produced by the coil 110, so as to produce an airflow heading toward the heat-generating element 220.

The magnetic element 140 may be a permanent magnet or a coil of wire. The permanent magnet may directly interact with the magnetic field, so as to drive the movable portion 122 to flutter periodically. The coil of wire must be electrically connected to a power source for allowing an electric current to flows through the coil of wire, so as to interact with the magnetic field of the coil 110.

Moreover, the flutter frequency of the vibrating sheet 120 is determined according to the power supply period of the power source, and the flutter amplitude of the vibrating sheet 120 is determined by the strength of the magnetic field produced by the coil 110, so as to control the vibrating sheet 120 to flutter only within a range below its original position, thereby avoiding colliding with the case of the electronic device 200 due to the inertia of the fluttering. The above design is applicable to the electronic device 200 with a narrow inner space.

Figure 3A:
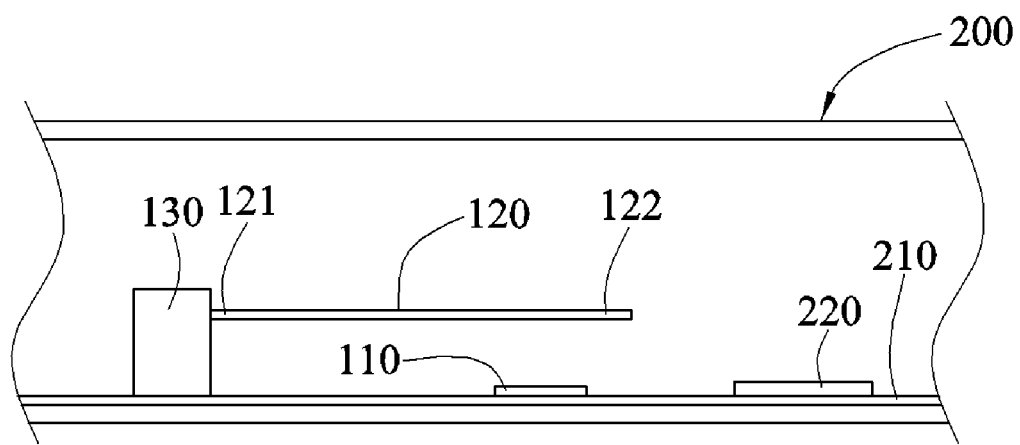
FIG. 3A is a side view of a heat dissipation device according to a second embodiment of the present invention.
Figure 3B:
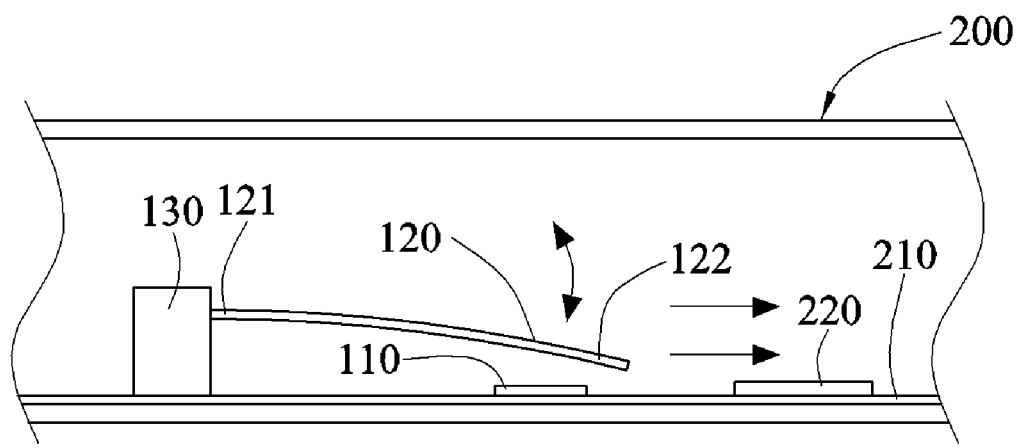
FIG. 3B is a side view of a heat dissipation device in operation according to a second embodiment of the present invention.

FIGS. 3A and 3B are side views of a second embodiment of the present invention. The vibrating sheet 120 of the present invention may be a ferromagnetic sheet with magnetic permeance, such that the vibrating sheet 120 has the material characteristics of magnetic permeance and elastic deformation. The vibrating sheet 120 is suspended above over the coil 110, and interacts with the magnetic field produced by the coil 110. Therefore, the movable portion 122 of the vibrating sheet 120 flutters up and down under the magnetic force of the magnetic field, so as to produce an airflow for dissipating the heat produced by the heat-generating element 220.

Figure 4A:
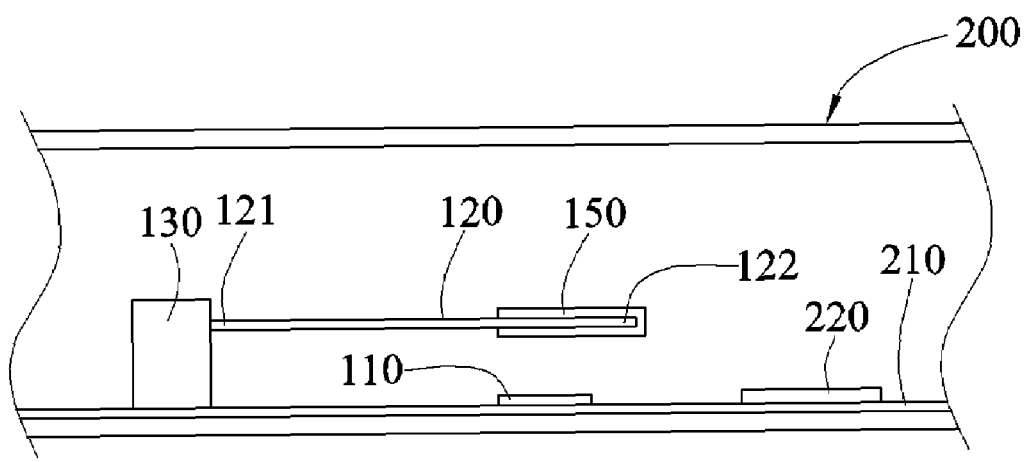
FIG. 4A is a side view of a heat dissipation device according to a third embodiment of the present invention.
Figure 4B:
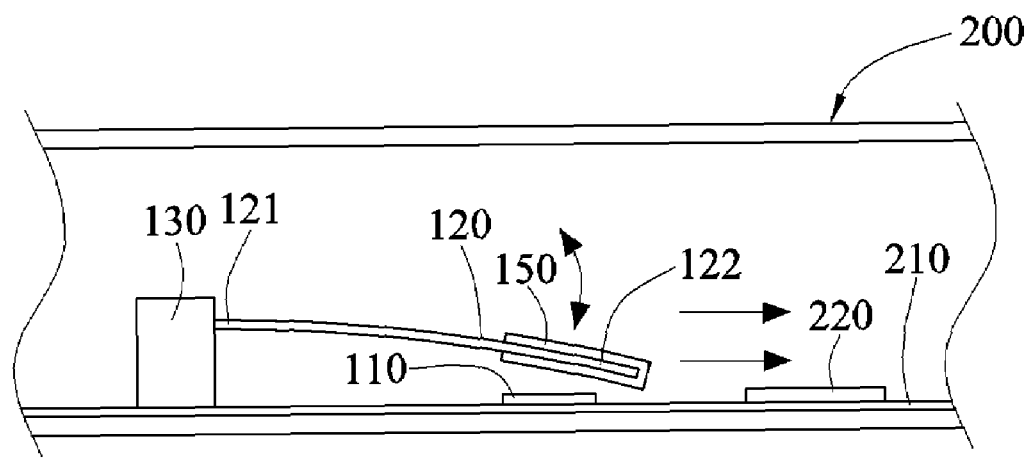
FIG. 4B is a side view of a heat dissipation device in operation according to a third embodiment of the present invention.

FIGS. 4A and 4B are side views of a third embodiment of the present invention. A block of ferromagnetic material 150 is covered on a portion of the surface of the movable portion 122, such that the movable portion 122 suspended over the coil 110 flutters up and down under the action of magnetic force of the magnetic field, so as to produce an airflow for dissipating the heat produced by the heat-generating element 220.

Figure 5A:
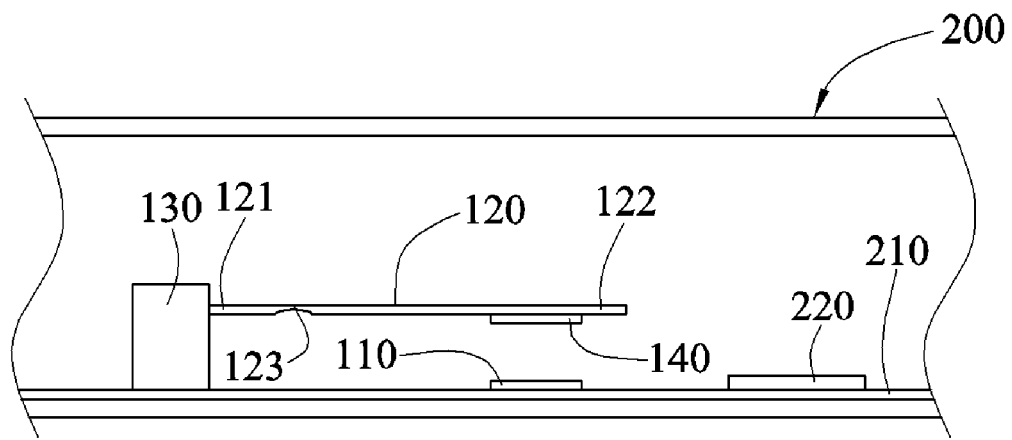
FIG. 5A is a side view of a vibrating sheet of a different configuration according to the present invention.
Figure 5B:
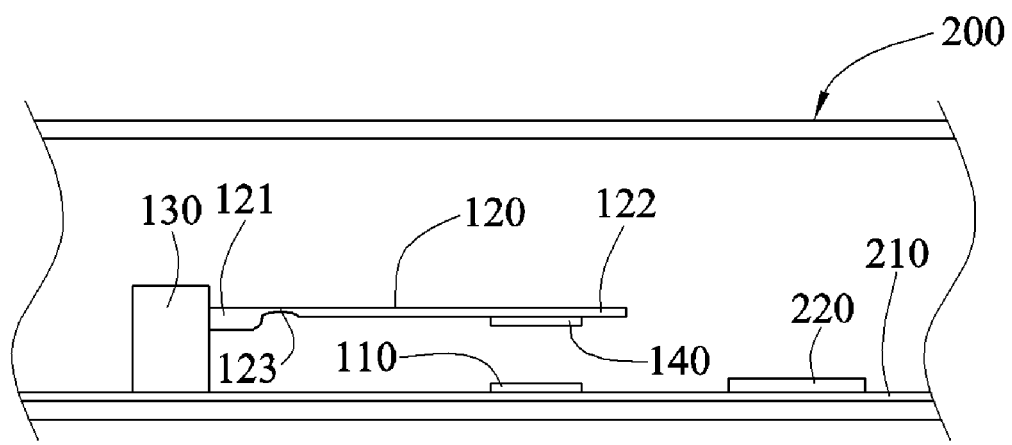
FIG. 5B is a side view of a vibrating sheet of a different configuration according to the present invention.
Figure 5C:
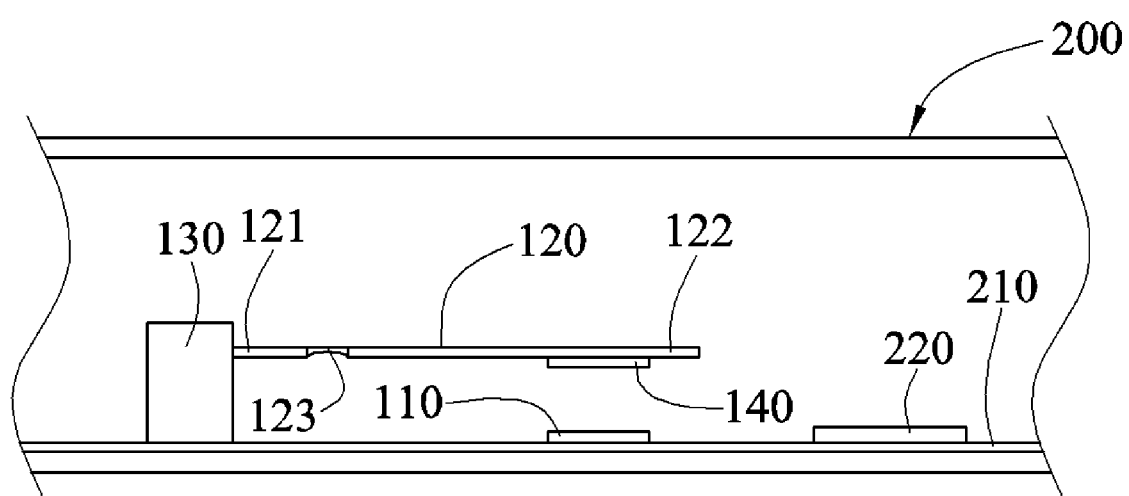
FIG. 5C is a side view of a vibrating sheet of a different configuration according to the present invention.

Referring to FIGS. 5A to 5C, side views of wiggling leaves of different configurations are shown. The vibrating sheet 120 of the present invention further includes a flexible portion 123 jointed between an end surface of the fixed portion 121 and an end surface of the movable portion 122 opposite to the end surface of the fixed portion 121. The vibrating sheet 120 having the fixed portion 121, the movable portion 122, and the flexible portion 123 may be formed monolingual. Or, the material of the flexible portion 123 may be different from that of the fixed portion 121 and the movable portion 122, and the elastic deformation coefficient of the flexible portion 123 is greater than those of the fixed portion 121 and movable portion 122, such that the flutter effect of the vibrating sheet 120 meets the heat dissipation requirement better. Moreover, the flexible portion 123 may be designed to make the cross section parallel to the fluttering direction smaller than the fixed portion 121 and the movable portion 122, such that the movable portion 122 will have better heat dissipation efficiency during fluttering, and the power consumption of the electronic device 200 may be reduced.

Compared with the conventional art, the heat dissipation device of the present invention is light, thin and has a simple structure, so the portable electronic device becomes much thinner. Besides, the way that the vibrating sheet repeats fluttering to blow an airflow for dissipating heat not only eliminates the very large noises caused by air friction of the conventional fan, but also solves the problem of excessive electric power consumed by the fan during operation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heat dissipation device, electrically connected to an intermittent power source, for dissipating heat generated by at least one heat-generating element on a circuit board, the heat dissipation device comprising:
    at least one coil for receiving the intermittent power source to produce a magnetic field;
    a support block disposed on the circuit board; and
    at least one vibrating sheet, having a fixed portion, a movable portion extending from the fixed portion, and a flexible portion jointing between the fixed portion and the movable portion, wherein the fixed portion is fixed on the support block disposed on the circuit board, and the movable portion is suspended over the coil via the flexible portion so that the movable portion flutters periodically under the magnetic force of the magnetic field, so as to produce an airflow, and wherein an area of cross section of the flexible portion is smaller than that of the fixed portion.

2. The heat dissipation device as claimed in claim 1, wherein a magnetic element corresponding to the coil is disposed on one side of the movable portion, so as to make the movable portion fluttering periodically under the magnetic force of the magnetic field.

3. The heat dissipation device as claimed in claim 2, wherein the magnetic element is a permanent magnet.

4. The heat dissipation device as claimed in claim 2, wherein the magnetic element is a coil of wire electrically connected to a power source for allowing an electric current to flows therethrough to produce a magnetic field.

5. The heat dissipation device as claimed in claim 1, wherein the vibrating sheet is ferromagnetic, so as to make the movable portion fluttering periodically under the magnetic force of the magnetic field.

6. The heat dissipation device as claimed in claim 1, wherein a block of ferromagnetic material is disposed on a portion of a surface of the movable portion, so as to make the movable portion fluttering periodically under the magnetic force of the magnetic field.

7. The heat dissipation device as claimed in claim 1, wherein an area of cross section of the flexible portion is smaller than that of the movable portion.

* * * * *